(12) United States Patent
Kojima et al.

(10) Patent No.: US 12,113,233 B2
(45) Date of Patent: Oct. 8, 2024

(54) POWER STORAGE MODULE

(71) Applicant: PRIME PLANET ENERGY & SOLUTIONS, INC., Tokyo (JP)

(72) Inventors: Yasumasa Kojima, Kasai (JP); Takashi Inamura, Himeji (JP); Takatoshi Kageyama, Kakogawa (JP)

(73) Assignee: Prime Planet Energy & Solutions, Inc., Tokyo (JP)

( * ) Notice: Subject to any disclaimer, the term of this patent is extended or adjusted under 35 U.S.C. 154(b) by 307 days.

(21) Appl. No.: 17/551,634

(22) Filed: Dec. 15, 2021

(65) Prior Publication Data

US 2022/0200064 A1 Jun. 23, 2022

(30) Foreign Application Priority Data

Dec. 21, 2020 (JP) ................................. 2020-211177

(51) Int. Cl.
| | |
|---|---|
| *H01M 50/30* | (2021.01) |
| *H01M 10/42* | (2006.01) |
| *H01M 50/209* | (2021.01) |
| *H01M 50/287* | (2021.01) |
| *H01M 50/383* | (2021.01) |
| *H01M 50/502* | (2021.01) |
| *H01M 50/519* | (2021.01) |

(Continued)

(52) U.S. Cl.
CPC ......... *H01M 50/30* (2021.01); *H01M 10/425* (2013.01); *H01M 50/209* (2021.01); *H01M 50/287* (2021.01); *H01M 50/383* (2021.01); *H01M 50/502* (2021.01); *H01M 50/519* (2021.01); *H05K 1/028* (2013.01); *H05K 2201/10037* (2013.01)

(58) Field of Classification Search
CPC ..... H01M 50/30; H01M 50/05; H01M 50/383
See application file for complete search history.

(56) References Cited

U.S. PATENT DOCUMENTS

| | | | |
|---|---|---|---|
| 2020/0044223 A1 | 2/2020 | Takase et al. | |
| 2021/0265700 A1* | 8/2021 | Egashira | H01M 50/204 |
| 2022/0013868 A1* | 1/2022 | Takahashi | H01M 50/50 |

FOREIGN PATENT DOCUMENTS

| | | | | |
|---|---|---|---|---|
| JP | 2020087665 A | * | 6/2020 | .......... H01M 50/507 |
| WO | WO 2018/066343 A1 | | 4/2018 | |
| WO | WO-2020003800 A1 | * | 1/2020 | .............. B60L 50/64 |

* cited by examiner

*Primary Examiner* — James M Erwin
*Assistant Examiner* — Zackary Richard Cochenour
(74) *Attorney, Agent, or Firm* — Finnegan, Henderson, Farabow, Garrett, and Dunner, LLP

(57) ABSTRACT

A plate member is provided with a gas exhaust port, an opening, and a wall portion. The opening is formed in a bottom surface portion at a position facing an electrode terminal. The wall portion protrudes from the bottom surface portion at positions on outer sides with respect to the gas exhaust port in a width direction of the plate member, and discontinuously extends in a stacking direction of power storage cells. A flexible printed circuit board has a main body portion, and a connection piece portion that extends from the main body portion and is curved so as to be connected to a connection terminal. A first gap is formed between the main body portion and the connection piece portion. A first auxiliary wall portion is provided in the first gap, the first auxiliary wall portion protruding from the bottom surface portion and extending in the stacking direction.

6 Claims, 4 Drawing Sheets

(51) Int. Cl.
*H05K 1/02* (2006.01)
*H01M 50/284* (2021.01)

POWER STORAGE MODULE

This nonprovisional application is based on Japanese Patent Application No. 2020-211177 filed on Dec. 21, 2020, with the Japan Patent Office, the entire contents of which are hereby incorporated by reference.

BACKGROUND OF THE INVENTION

Field of the Invention

The present technology relates to a power storage module.

Description of the Background Art

A connection module, which employs a flexible printed circuit board, for a power storage device has been conventionally known. For example, WO 2018/066343 discloses a connection module including a folded flexible printed circuit board. The connection module is placed on an upper surface of a power storage element group so as to surround a gas exhaust duct provided at the central portion of the upper surface of the power storage element group.

In the connection module described in WO 2018/066343, since the flexible printed circuit board is folded, the configuration thereof is complicated. If a combustible gas and a spark are generated from a power storage element in the connection module, it is preferable to suppress the spark from being exposed to the outside of the module while maintaining pressure of the combustible gas in the module to be low. An oxygen concentration outside the module is higher than an oxygen concentration inside the module. In the connection module described in WO 2018/066343, pressure inside the gas exhaust duct may become high due to the combustible gas flowing into the gas exhaust duct.

SUMMARY OF THE INVENTION

An object of the present technology is to provide a power storage module with a simple configuration to suppress a spark from being exposed to outside of the module while maintaining pressure of a combustible gas in the module to be low.

A power storage module according to the present technology includes a stack, a resin plate, a flexible printed circuit board, and a connection terminal. In the stack, a plurality of power storage cells each including an electrode terminal and a gas discharge valve are stacked in a stacking direction. The resin plate has a bottom surface portion extending in each of the stacking direction and a width direction orthogonal to the stacking direction, and is placed on the stack. The flexible printed circuit board is placed on the bottom portion and has an electric circuit electrically connected to the plurality of power storage cells. The connection terminal is provided on the flexible printed circuit board and is electrically connected to the electrode terminal. The resin plate is provided with a gas exhaust port, an opening, and a wall portion. The gas exhaust port is formed in the bottom surface portion at a position facing the gas discharge valve. The opening is formed in the bottom surface portion at a position facing the electrode terminal. The wall portion protrudes from the bottom portion at positions on outer sides with respect to the gas exhaust port in the width direction and discontinuously extends in the stacking direction. The flexible printed circuit board has a main body portion and a connection piece portion. The connection piece portion extends from the main body portion and is curved so as to be connected to the connection terminal. A first gap is formed between the main body portion and the connection piece portion. A first auxiliary wall portion is provided in the first gap, the first auxiliary wall portion protruding from the bottom portion and extending in the stacking direction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
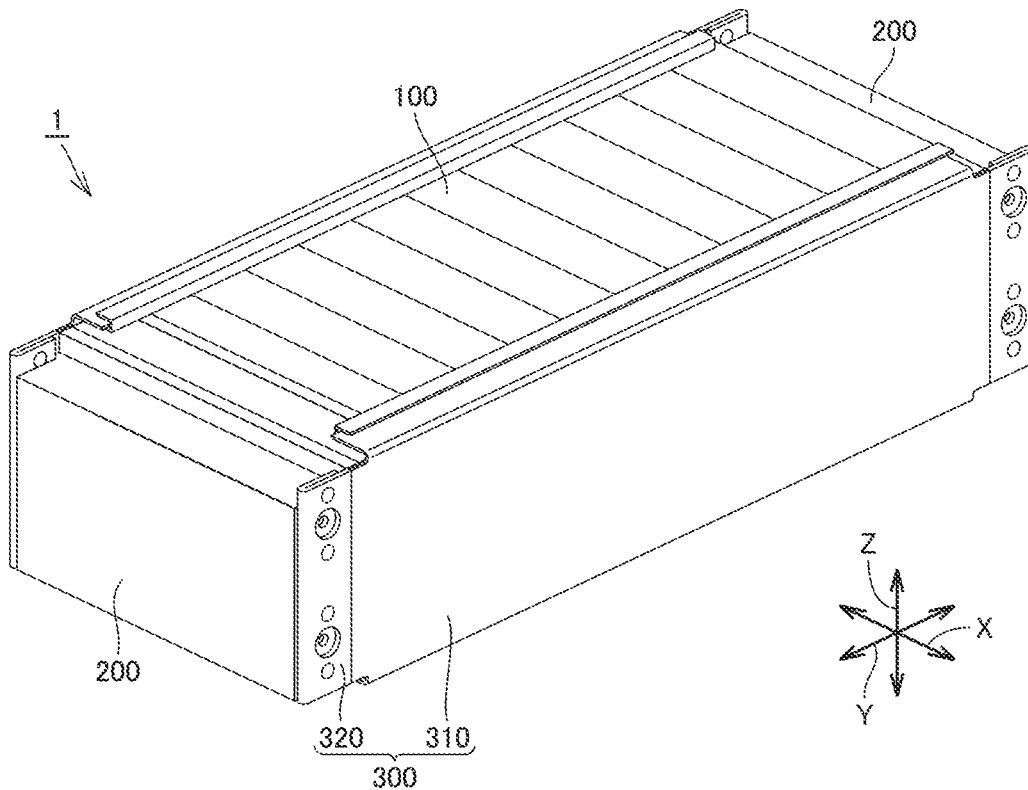
FIG. 1 is a diagram showing a basic configuration of a battery pack.

Hereinafter, embodiments of the present technology will be described. It should be noted that the same or corresponding portions are denoted by the same reference characters, and may not be described repeatedly.

It should be noted that in the embodiments described below, when reference is made to number, amount, and the like, the scope of the present technology is not necessarily limited to the number, amount, and the like unless otherwise stated particularly. Further, in the embodiments described below, each component is not necessarily essential to the present technology unless otherwise stated particularly.

It should be noted that in the present specification, the terms "comprise", "include", and "have" are open-end terms. That is, when a certain configuration is included, a configuration other than the foregoing configuration may or may not be included. Further, the present technology is not limited to one that necessarily exhibits all the functions and effects stated in the present embodiment.

In the present specification, the term "battery" is not limited to a lithium ion battery, and may include another battery such as a nickel-metal hydride battery. In the present specification, the term "electrode" may collectively represent a positive electrode and a negative electrode. Further, the term "electrode plate" may collectively represent a positive electrode plate and a negative electrode plate.

In the present specification, the "power storage cell" or the "power storage module" is not limited to a battery cell or a battery module, and may include a capacitor cell or a capacitor module.

Figure 2:
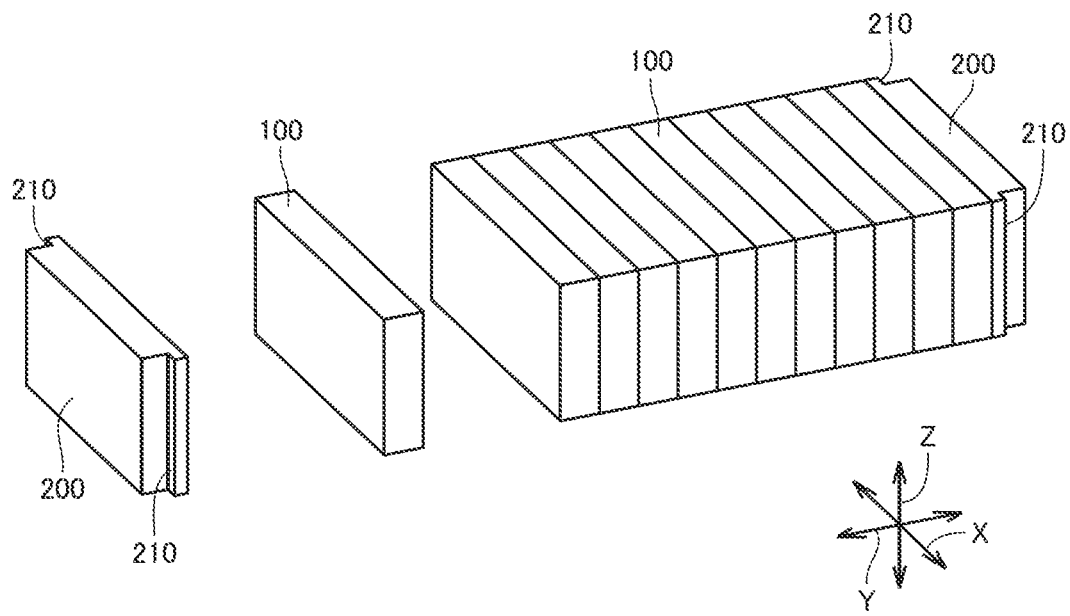
FIG. 2 is a diagram showing battery cells and end plates in the battery pack shown in FIG. 1.

FIG. 1 is a diagram showing a basic configuration of a battery pack 1. FIG. 2 is a diagram showing battery cells 100 and end plates 200 included in battery pack 1.

As shown in FIGS. 1 and 2, battery pack 1, which serves as an exemplary "power storage module", includes battery cells 100, end plates 200, and a restraint member 300.

The plurality of battery cells 100 are provided side by side in a Y axis direction (arrangement direction). Thus, a stack of battery cells 100 is formed. A separator (not shown) is interposed between the plurality of battery cells 100. The plurality of battery cells 100, which are sandwiched between two end plates 200, are pressed by end plates 200, and are therefore restrained between two end plates 200.

End plates 200 are disposed beside both ends of battery pack 1 in the Y axis direction. Each of end plates 200 is fixed to a base such as a case that accommodates battery pack 1. Stepped portions 210 are formed at both ends of end plate 200 in an X axis direction (width direction).

Restraint member 300 connects two end plates 200 to each other. Restraint member 300 is attached to stepped portions 210 formed on two end plates 200.

Restraint member 300 is engaged with end plates 200 with compression force in the Y axis direction being exerted to the stack of the plurality of battery cells 100 and end plates 200, and then the compression force is released, with the result that tensile force acts on restraint member 300 that connects two end plates 200 to each other. As a reaction thereto, restraint member 300 presses two end plates 200 in directions of bringing them closer to each other.

Restraint member 300 includes a first member 310 and a second member 320. First member 310 and second member 320 are coupled to each other by butt welding, for example. Tip surfaces formed by folding second member 320 are brought into abutment with stepped portions 210 of end plate 200 in the Y axis direction.

Figure 3:
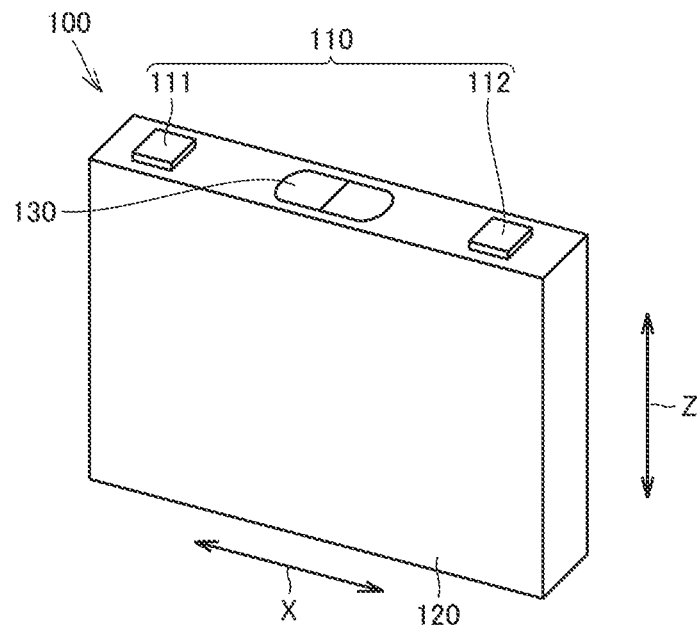
FIG. 3 is a diagram showing a battery cell in the battery pack shown in FIG. 1.

FIG. 3 is a diagram showing battery cell 100 in battery pack 1. As shown in FIG. 3, battery cell 100 includes electrode terminal 110, a housing 120, and a gas discharge valve 130.

Electrode terminal 110 includes a positive electrode terminal 111 and a negative electrode terminal 112. Electrode terminal 110 is formed on housing 120. Housing 120 is formed to have a substantially rectangular parallelepiped shape. An electrode assembly (not shown) and an electrolyte solution (not shown) are accommodated in housing 120. Gas discharge valve 130 is formed at an intermediate position between positive electrode terminal 111 and negative electrode terminal 112 on housing 120. Gas discharge valve 130 is fractured when pressure inside housing 120 becomes more than or equal to a threshold value. Thus, a combustible gas in housing 120 is discharged to the outside of housing 120.

Figure 4:
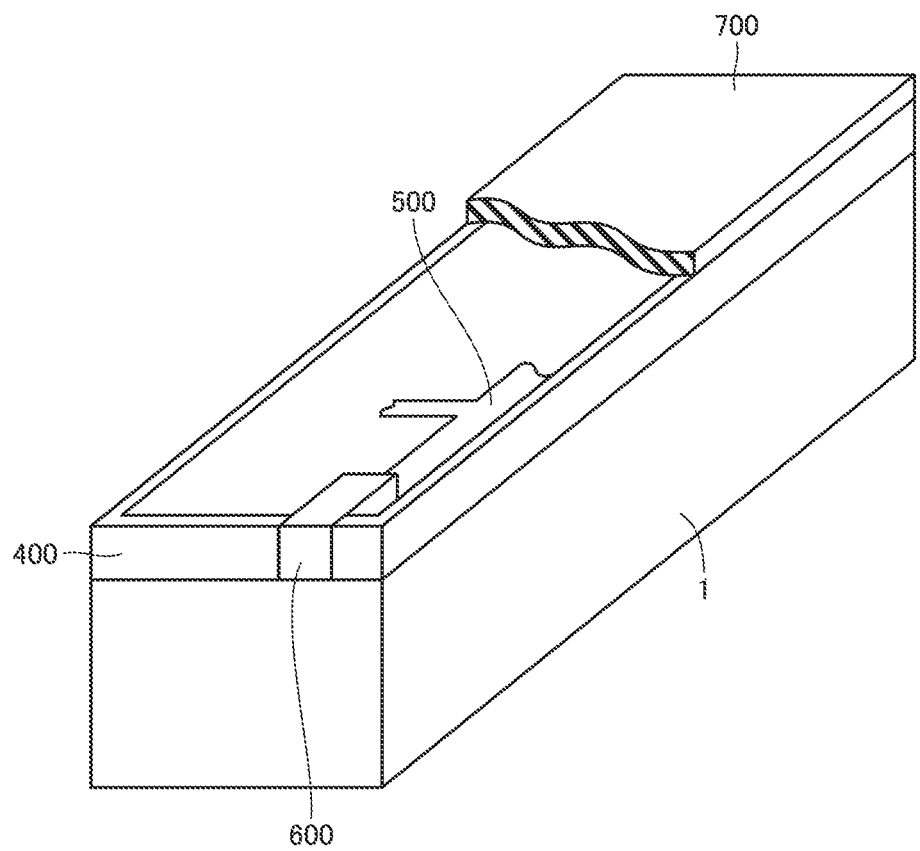
FIG. 4 is a perspective view showing a state in which a wiring module is provided on the battery pack.

FIG. 4 is a perspective view showing a state in which a wiring module is provided on battery pack 1. As shown in FIG. 4, a plate member 400 is placed on battery pack 1, and a flexible printed circuit board 500 is provided on plate member 400. Flexible printed circuit board 500 can be electrically connected to an external device via a connector 600. A cover member 700 is provided on plate member 400 so as to cover flexible printed circuit board 500.

Figure 5:
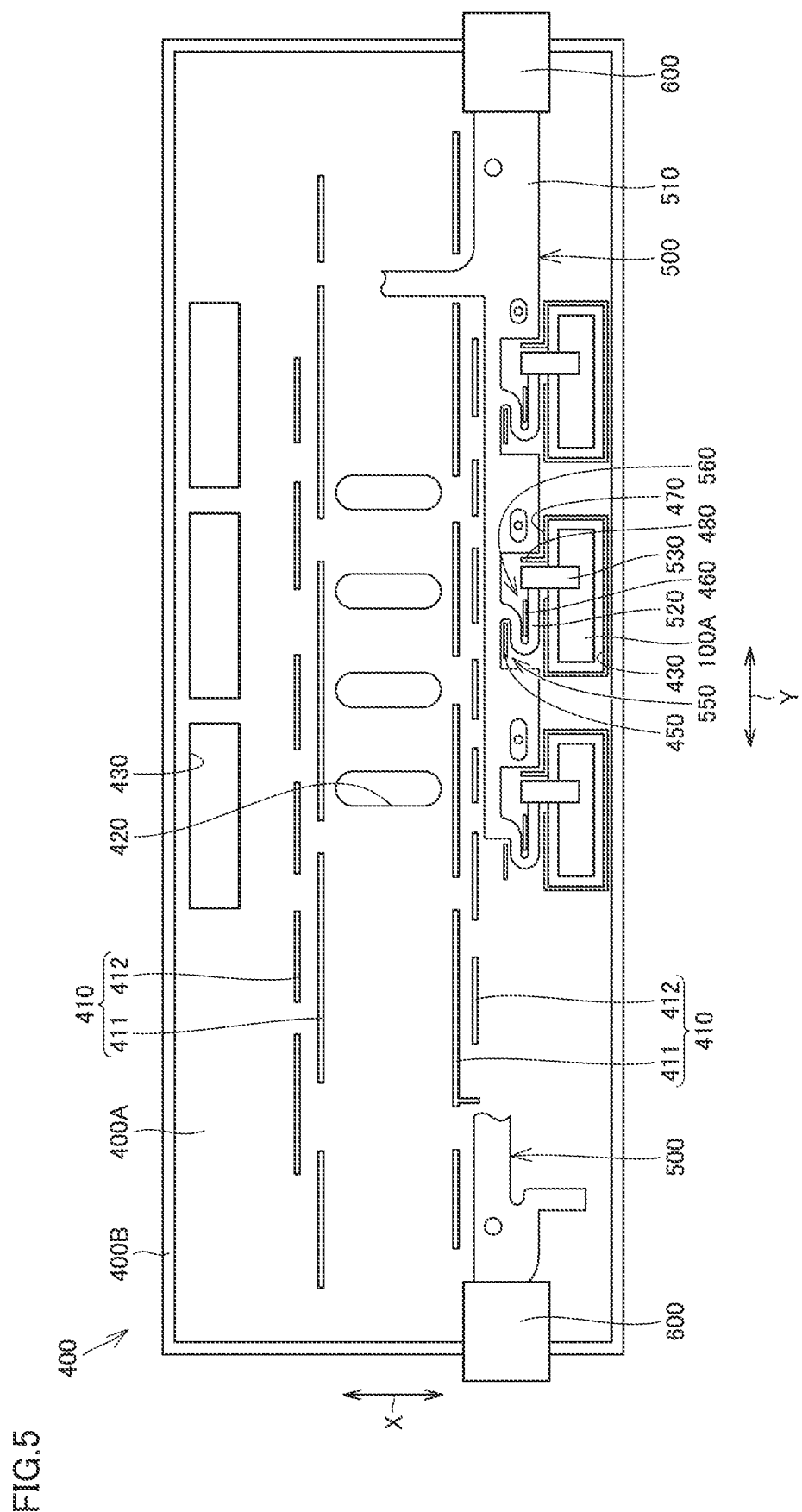
FIG. 5 is a schematic top view of the wiring module placed on the battery pack.

FIG. 5 is a schematic top view of the wiring module placed on battery pack 1. As shown in FIG. 5, the wiring module includes plate member 400, flexible printed circuit board 500, and connector 600.

Plate member 400 (bus bar plate) is a resin plate having insulation property and heat resistance. Plate member 400 has: a bottom surface portion 400A extending in each of the X axis direction and the Y axis direction; and a side surface portion 400B formed to extend upward from bottom surface portion 400A in a Z axis direction. Plate member 400 includes a wall portion 410, gas exhaust ports 420, and openings 430.

Wall portion 410 is formed to extend upward from bottom surface portion 400A of plate member 400 in the Z axis direction. Wall portion 410 protrudes from bottom surface portion 400A at positions on outer sides with respect to gas exhaust port 420 in the X axis direction (width direction) and discontinuously extends in the Y axis direction (stacking direction). Specifically, wall portion 410 includes: a first wall portion 411 formed on the center side in the X axis direction; and a second wall portion 412 provided on the outer side in the X axis direction in parallel with first wall portion 411. Each of first wall portion 411 and second wall portion 412 is formed to extend discontinuously in the Y axis direction.

Each of first wall portion 411 and second wall portion 412 can serve as a protection wall that prevents a spark generated in plate member 400 from being directly exposed to outside while securing a path for discharging, to the outside of the battery pack, the combustible gas discharged from housing 120 of battery cell 100 and having passed through gas exhaust port 420.

Gas exhaust port 420 is formed in bottom surface portion 400A at a position facing gas discharge valve 130. Opening 430 is formed in bottom surface portion 400A at a position facing electrode terminal 110.

Flexible printed circuit board 500 is placed on bottom surface portion 400A of plate member 400. Flexible printed circuit board 500 is a board in which an electric circuit is formed on a base member including a base film having an insulation property and a conductive metal foil. The base film is composed of, for example, polyimide or the like. The conductive metal foil is composed of, for example, a copper foil or the like. Flexible printed circuit board 500 has flexibility and has such a characteristic that the electric characteristics of flexible printed circuit board 500 are maintained even when deformed.

A connection terminal 530 electrically connected to electrode terminal 110 is provided on flexible printed circuit board 500. Connection terminal 530 is joined to a bus bar 100A that couples electrode terminals 110 of the plurality of battery cells 100. Thus, the electric circuit provided on flexible printed circuit board 500 and battery pack 1 are electrically connected to each other.

Connector 600 is fixed to flexible printed circuit board 500. The electric circuit in flexible printed circuit board 500 and an external electric device can be electrically connected to each other via connector 600.

Figure 6:
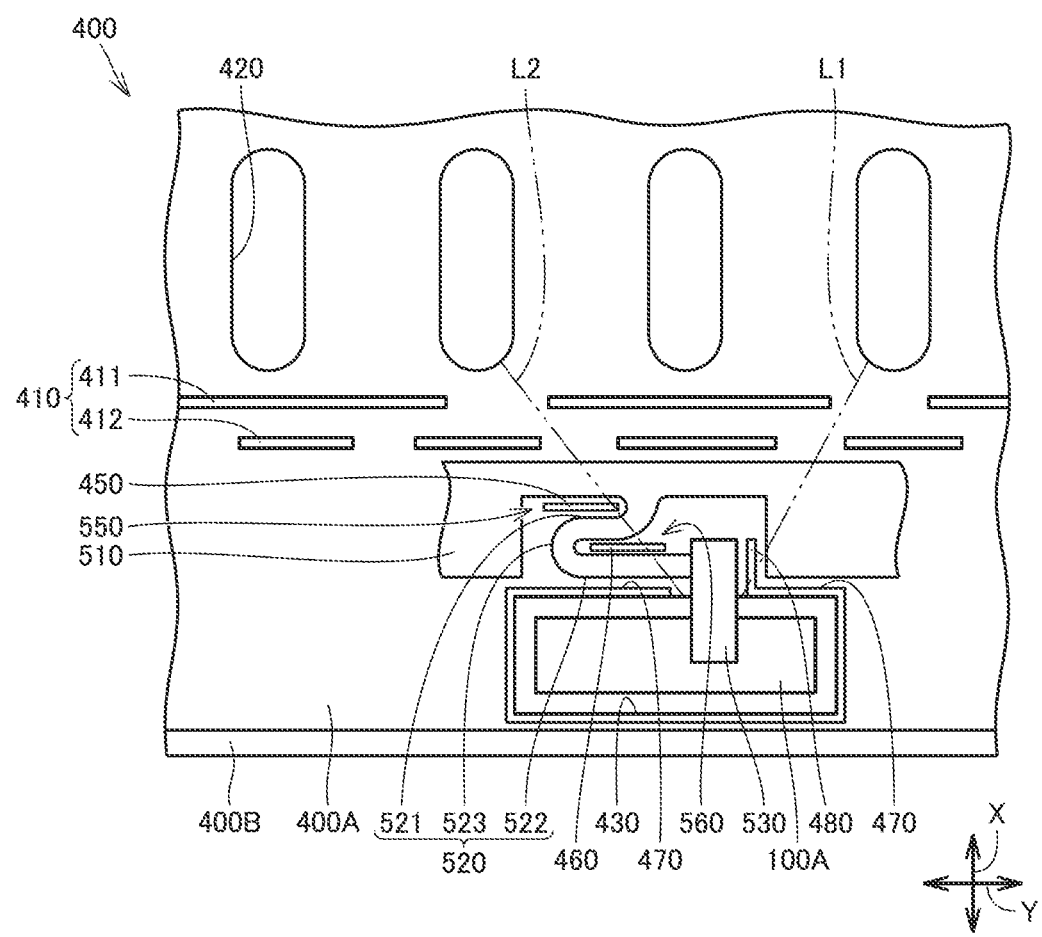
FIG. 6 is an enlarged partial top view showing surroundings of a connection piece portion of a flexible printed circuit board and a connection terminal.

FIG. 6 is an enlarged partial top view showing surroundings of a connection piece portion of a flexible printed circuit board and a connection terminal. As shown in FIGS. 5 and 6, flexible printed circuit board 500 includes a main body portion 510 and a connection piece portion 520.

Connection piece portion 520 extends from main body portion 510 and is curved. In the present embodiment, connection piece portion 520 extends from main body portion 510 and is turned around to have a substantially U-shape. Connection piece portion 520 extends from an end edge of main body portion 510 in the X axis direction. However, connection piece portion 520 may extend from an end edge of main body portion 510 in the Y axis direction.

Connection piece portion 520 includes: a first straight portion 521 extending straightly in the Y axis direction; and a second straight portion 522 extending in parallel with first straight portion 521. First straight portion 521 is located on the main body portion side with respect to second straight portion 522. First straight portion 521 and second straight portion 522 are connected to each other by a semi-arc portion 523. In the present embodiment, second straight portion 522 is longer than first straight portion 521; however, first straight portion 521 may be longer than second straight portion 522.

A first gap 550 is formed between main body portion 510 and connection piece portion 520. First straight portion 521 extends in parallel with main body portion 510 with first gap 550 being interposed between first straight portion 521 and main body portion 510. A second gap 560 is formed between first straight portion 521 and second straight portion 522.

Connection terminal 530 is connected to the tip of connection piece portion 520. Specifically, connection terminal 530 is connected to the tip of second straight portion 522. Displacements (in the X axis direction, the Y axis direction, and the Z axis direction) of connection terminal 530 can be absorbed by connection piece portion 520.

A first auxiliary wall portion 450 is provided in first gap 550, first auxiliary wall portion 450 protruding from bottom surface portion 400A and extending in the Y axis direction (stacking direction). That is, plate member 400 further includes first auxiliary wall portion 450 provided to stand on bottom surface portion 400A and extending in the Y axis direction (stacking direction) in first gap 550. The size of the thickness of first auxiliary wall portion 450 in the X axis direction is smaller than the size of the width of first gap 550 in the X axis direction to such an extent that connection piece portion 520 can absorb displacement of connection terminal 530.

A second auxiliary wall portion 460 is provided in second gap 560, second auxiliary wall portion 460 protruding from bottom surface portion 400A and extending in the Y axis direction (stacking direction). That is, plate member 400 further includes second auxiliary wall portion 460 provided to stand on bottom surface portion 400A and extending in the Y axis direction (stacking direction) in second gap 560. The size of the thickness of second auxiliary wall portion 460 in the X axis direction is smaller than the size of the width of second gap 560 in the X axis direction to such an extent that connection piece portion 520 can absorb displacement of connection terminal 530. It should be noted that second auxiliary wall portion 460 may not be necessarily provided.

Each of a third auxiliary wall portion 470 and a fourth auxiliary wall portion 480 is provided at a portion of an edge of opening 430, third auxiliary wall portion 470 protruding from bottom surface portion 400A and extending in the Y axis direction (stacking direction), fourth auxiliary wall portion 480 protruding from bottom surface portion 400A and extending in the X axis direction (width direction). That is, plate member 400 further includes: third auxiliary wall portion 470 provided to stand on bottom surface portion 400A and extending in the Y axis direction (stacking direction) along the edge of opening 430; and fourth auxiliary wall portion 480 provided to stand on bottom surface portion 400A and extending from the edge of opening 430 in the X axis direction (width direction). Third auxiliary wall portion 470 is provided on the edge of opening 430 at a portion that is out of a range in which connection terminal 530 is displaced.

As shown in FIG. 6, fourth auxiliary wall portion 480 is provided at a position intersecting an imaginary line segment L1 that straightly connects gas exhaust port 420 to opening 430 without intersecting either of wall portion 410 and third auxiliary wall portion 470 when viewed in the direction (Z axis direction) orthogonal to bottom surface portion 400A.

When viewed in the direction (Z axis direction) orthogonal to bottom surface portion 400A, first auxiliary wall portion 450 is provided at a position intersecting an imaginary line segment L2 that straightly connects gas exhaust port 420 to opening 430 without intersecting any of wall portion 410, third auxiliary wall portion 470, and fourth auxiliary wall portion 480.

Similarly, second auxiliary wall portion 460 is provided at a position intersecting imaginary line segment L2 that straightly connects gas exhaust port 420 to opening 430 without intersecting any of wall portion 410, third auxiliary wall portion 470, and fourth auxiliary wall portion 480 when viewed in the direction (Z axis direction) orthogonal to bottom surface portion 400A.

Connection piece portion 520 is formed to be turned around in the present embodiment; however, connection piece portion 520 may be configured in any manner as long as connection piece portion 520 is curved. Here, the following describes a modification in which the connection piece portion is not turned around and is curved.

Figure 7:
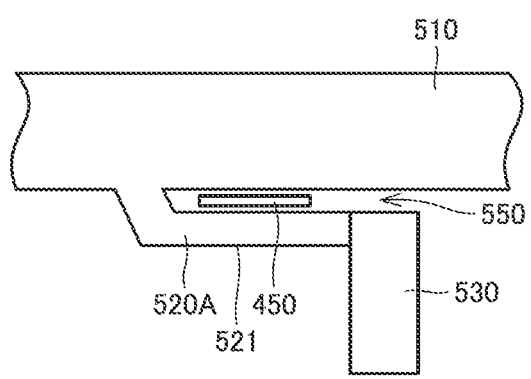
FIG. 7 is an enlarged partial top view showing surroundings of a connection piece portion of a flexible printed circuit board and a connection terminal according to a modification.

FIG. 7 is an enlarged partial top view showing surroundings of a connection piece portion of a flexible printed circuit board and a connection terminal according to the modification. As shown in FIG. 7, in the modification, a connection piece portion 520A extends from main body portion 510, is not turned around, and is curved. First gap 550 is formed between main body portion 510 and connection piece portion 520A.

Specifically, connection piece portion 520A includes first straight portion 521 straightly extending in the Y axis direction. First straight portion 521 extends in parallel with main body portion 510 with first gap 550 being interposed between first straight portion 521 and main body portion 510. Connection terminal 530 is connected to the tip of first straight portion 521.

In the power storage module according to the present embodiment, plate member 400 is provided with gas exhaust port 420, opening 430, and wall portion 410. Gas exhaust port 420 is formed in bottom surface portion 400A at a position facing gas discharge valve 130. Opening 430 is formed in bottom surface portion 400A at a position facing electrode terminal 110. Wall portion 410 protrudes from bottom surface portion 400A at positions on outer sides with respect to gas exhaust port 420 in the X axis direction (width direction), and discontinuously extends in the Y axis direction (stacking direction). Flexible printed circuit board 500 has main body portion 510, and connection piece portion 520 that extends from main body portion 510 and is curved so as to be connected to connection terminal 530. First gap 550 is formed between main body portion 510 and connection piece portion 520. First auxiliary wall portion 450 is provided in first gap 550, first auxiliary wall portion 450 protruding from bottom surface portion 400A and extending in the Y axis direction (stacking direction).

Since wall portion 410 discontinuously extends, a combustible gas discharged from housing 120 of battery cell 100 and having passed through gas exhaust port 420 is spread from inside of a space surrounded by wall portion 410 to outside of wall portion 410 in plate member 400, with the result that pressure of the combustible gas in the module can be made low. Further, since first auxiliary wall portion 450 is provided in first gap 550 between main body portion 510 and connection piece portion 520, a spark can be suppressed from directly reaching opening 430 and being exposed to the outside. In the present embodiment, with such a simple configuration that flexible printed circuit board 500 does not need to be folded and first auxiliary wall portion 450 is provided in first gap 550, a spark can be suppressed from being exposed to outside of the module while maintaining the pressure of the combustible gas in the module to be low.

In the power storage module according to the present embodiment, connection piece portion 520 extends from main body portion 510 and is turned around, and includes first straight portion 521 that straightly extends in the Y axis direction (stacking direction), and second straight portion 522 that extends in parallel with first straight portion 521. Second gap 560 is formed between first straight portion 521 and second straight portion 522. Second auxiliary wall portion 460 is provided in second gap 560, second auxiliary wall portion 460 protruding from bottom surface portion 400A and extending in the Y axis direction (stacking direction). Thus, with such a simple configuration that second auxiliary wall portion 460 is provided in second gap 560, a spark can be suppressed from being exposed to the outside of the module while maintaining the pressure of the combustible gas in the module to be low.

In the power storage module according to the present embodiment, each of third auxiliary wall portion 470 and fourth auxiliary wall portion 480 is provided at a portion of an edge of opening 430, third auxiliary wall portion 470 protruding from bottom surface portion 400A and extending in the Y axis direction (stacking direction), fourth auxiliary wall portion 480 protruding from bottom surface portion 400A and extending in the X axis direction (width direction). Thus, by each of third auxiliary wall portion 470 and fourth auxiliary wall portion 480, a spark can be suppressed from directly reaching opening 430 and being exposed to the outside.

In the power storage module according to the present embodiment, fourth auxiliary wall portion 480 is provided at a position intersecting imaginary line segment L1 that straightly connects gas exhaust port 420 to opening 430 without intersecting either of wall portion 410 and third auxiliary wall portion 470 when viewed in the direction (Z axis direction) orthogonal to bottom surface portion 400A. Thus, by fourth auxiliary wall portion 480, a spark can be effectively suppressed from directly reaching opening 430 and being exposed to the outside.

In the power storage module according to the present embodiment, first auxiliary wall portion 450 is provided at a position intersecting imaginary line segment L2 that straightly connects gas exhaust port 420 to opening 430 without intersecting any of wall portion 410, third auxiliary wall portion 470, and fourth auxiliary wall portion 480 when viewed in the direction (Z axis direction) orthogonal to bottom surface portion 400A. Thus, by first auxiliary wall portion 450, a spark can be effectively suppressed from directly reaching opening 430 and being exposed to the outside.

In the power storage module according to the present embodiment, second auxiliary wall portion 460 is provided at a position intersecting imaginary line segment L2 that straightly connects gas exhaust port 420 to opening 430 without intersecting any of wall portion 410, third auxiliary wall portion 470, and fourth auxiliary wall portion 480 when viewed in the direction (Z axis direction) orthogonal to bottom surface portion 400A. Thus, by second auxiliary wall portion 460, a spark can be effectively suppressed from directly reaching opening 430 and being exposed to the outside.

Also in the power storage module according to the modification, with such a simple configuration that flexible printed circuit board 500 does not need to be folded and first auxiliary wall portion 450 is provided in first gap 550, a spark can be suppressed from being exposed to the outside of the module while maintaining the pressure of the combustible gas in the module to be low.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A power storage module comprising:
    a stack in which a plurality of power storage cells each including an electrode terminal and a gas discharge valve are stacked in a stacking direction;
    a resin plate having a bottom surface portion extending in each of the stacking direction and a width direction orthogonal to the stacking direction, the resin plate being placed on the stack;
    a flexible printed circuit board placed on the bottom surface portion and having an electric circuit electrically connected to the plurality of power storage cells; and
    a connection terminal provided on the flexible printed circuit board and electrically connected to the electrode terminal, wherein
    the resin plate is provided with
        a gas exhaust port formed in the bottom surface portion at a position facing the gas discharge valve,
        an opening formed in the bottom surface portion at a position facing the electrode terminal, and
        a wall portion that protrudes from the bottom surface portion at positions on outer sides with respect to the gas exhaust port in the width direction and that discontinuously extends in the stacking direction,
    the connection terminal is electrically connected to the electrode terminal while penetrating the opening,
    the flexible printed circuit board has a main body portion, and a connection piece portion that extends from the main body portion and is curved so as to be connected to the connection terminal,
    a first gap is formed between the main body portion and the connection piece portion, and
    a first auxiliary wall portion is provided in the first gap, the first auxiliary wall portion protruding from the bottom surface portion and extending in the stacking direction.

2. The power storage module according to claim 1, wherein
    the connection piece portion extends from the main body portion and is turned around, and includes a first straight portion that straightly extends in the stacking direction, and a second straight portion that extends in parallel with the first straight portion,
    a second gap is formed between the first straight portion and the second straight portion, and
    a second auxiliary wall portion is provided in the second gap, the second auxiliary wall portion protruding from the bottom surface portion and extending in the stacking direction.

3. The power storage module according to claim 1, wherein each of a third auxiliary wall portion and a fourth auxiliary wall portion is provided at a portion of an edge of the opening, the third auxiliary wall portion protruding from the bottom surface portion and extending in the stacking direction, the fourth auxiliary wall portion protruding from the bottom surface portion and extending in the width direction.

4. The power storage module according to claim 2, wherein each of a third auxiliary wall portion and a fourth auxiliary wall portion is provided at a portion of an edge of the opening, the third auxiliary wall portion protruding from the bottom surface portion and extending in the stacking direction, the fourth auxiliary wall portion protruding from the bottom surface portion and extending in the width direction.

5. The power storage module according to claim 3, wherein the first auxiliary wall portion is provided at a position intersecting an imaginary line segment that straightly connects the gas exhaust port to the opening without intersecting any of the wall portion, the third auxiliary wall portion, and the fourth auxiliary wall portion when viewed in a direction orthogonal to the bottom surface portion.

6. The power storage module according to claim 4, wherein the first auxiliary wall portion is provided at a position intersecting an imaginary line segment that straightly connects the gas exhaust port to the opening without intersecting any of the wall portion, the third auxiliary wall portion, and the fourth auxiliary wall portion when viewed in a direction orthogonal to the bottom surface portion.

\* \* \* \* \*